(12) United States Patent
Mukai et al.

(10) Patent No.: US 7,876,626 B2
(45) Date of Patent: Jan. 25, 2011

(54) SEMICONDUCTOR MEMORY DEVICE AND SEMICONDUCTOR MEMORY SYSTEM

(75) Inventors: Hideo Mukai, Tokyo (JP); Hiroshi Maejima, Chigasaki (JP); Satoru Takase, Yokohama (JP); Naoya Tokiwa, Fujisawa (JP); Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/408,232

(22) Filed: Mar. 20, 2009

(65) Prior Publication Data

US 2009/0237979 A1 Sep. 24, 2009

(30) Foreign Application Priority Data

Mar. 21, 2008 (JP) .............................. 2008-074087

(51) Int. Cl.
*G11C 7/00* (2006.01)
(52) U.S. Cl. .............................. 365/189.14; 365/189.07; 365/233.1
(58) Field of Classification Search ............ 365/189.05, 365/189.07, 189.14, 230.01, 230.03, 233.1
See application file for complete search history.

(56) References Cited

U.S. PATENT DOCUMENTS

| | | | | |
|---|---|---|---|---|
| 6,111,807 A | * | 8/2000 | Ooishi .................. | 365/189.14 |
| 6,259,647 B1 | * | 7/2001 | Ooishi .................. | 365/189.14 |
| 6,396,768 B2 | * | 5/2002 | Ooishi .................. | 365/193 |
| 7,106,621 B2 | * | 9/2006 | Frey .................... | 365/158 |
| 7,518,922 B2 | * | 4/2009 | Maejima et al. ........ | 365/185.17 |
| 2007/0280031 A1 | | 12/2007 | Maejima et al. | |

FOREIGN PATENT DOCUMENTS

| JP | 7-240098 A | 9/1995 |
|---|---|---|
| JP | 2005-108304 A | 4/2005 |
| JP | 2005-157781 A | 6/2005 |

* cited by examiner

*Primary Examiner*—Gene N Auduong
(74) *Attorney, Agent, or Firm*—Oblon, Spivak, McClelland, Maier & Neustadt, L.L.P.

(57) ABSTRACT

A semiconductor memory device comprises a memory cell array including a plurality of memory cells arranged at intersections of word lines and bit lines; a read/write circuit operative to execute data read/write to the memory cell; and an operational circuit operative to compare certain length data read out by the read/write circuit from plural ones of the memory cells with certain length data to be written in the plural memory cells to make a decision, and create a flag representing the decision result. The read/write circuit inverts each bit in the certain length data to be written in the memory cells in accordance with the flag, and writes only rewrite-intended data of the certain length data and the flag. The read/write circuit reads the certain length data together with the flag corresponding thereto, and inverts each bit in the certain length data in accordance with the flag.

20 Claims, 15 Drawing Sheets

FIG. 6
(a) Schottky Structure
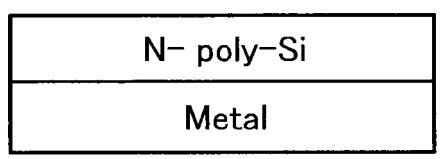
(d) MIM Structure
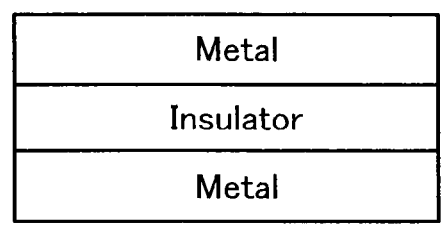
(b) PN Structure
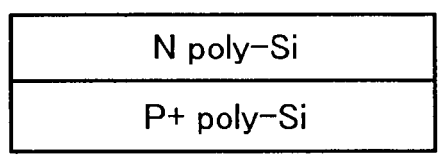
(e) SIS Structure
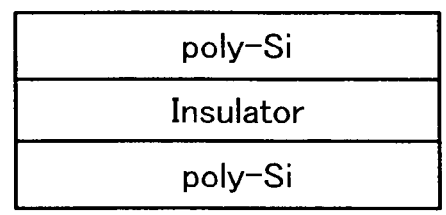
(c) PIN Structure
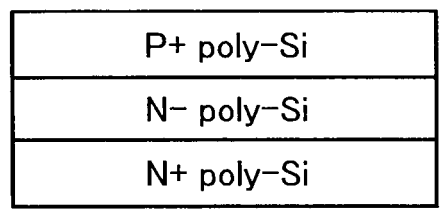

FIG. 12

| Write | Data | Flag | |
|---|---|---|---|
| Current Cell Data | 10111011 | 1 | |
| Read Data | 10111011 | | |
| Write Data | 00011100 | | |
| Rewrite Bits | (5bits) | | ← Majority |
| Data Inversion | 11100011 | 0 | |
| Write Execution | X1X00XXX | 0 | 1:Reset 0:Set X:Non-Rewrite |

| Read | | | |
|---|---|---|---|
| Current Cell Data | 11100011 | 0 | |
| Read Data | 00011100 | | ← Inversion Read for Flag "0" |

FIG. 13

| Write | Data | Flag | |
|---|---|---|---|
| Current Cell Data | 11100011 | 0 | |
| Read Data | 11100011 | | |
| Write Data | 11110001 | | |
| Rewrite Bits | (2bits) | | ← Not Majority |
| Write Execution | XXX1XX0X | 1 | 1:Reset 0:Set X:Non-Rewrite |

| Read | | | |
|---|---|---|---|
| Current Cell Data | 11110001 | 1 | |
| Read Data | 11110001 | | ← Non-Inversion Read for Flag "1" |

FIG. 15

|  | Data | Flag |  |
|---|---|---|---|
| Write | | | |
| Current Cell Data | 11111000 | 1 | |
| Read Data | 11111000 | | |
| Write Data | 11111111 | | |
| Data Inversion | 00000000 | 0 | |
| Write Execution | 00000XXX | 0 | 1:Reset 0:Set X:Non-Rewrite |
| Read | | | |
| Current Cell Data | 00000000 | 0 | |
| Read Data | 11111111 | | ← Inversion Read for Flag "0" |

FIG. 16

|  | Data | | Flag | |
|---|---|---|---|---|
| Write | | | | |
| Current Cell Data | 10111011 | 00111000 | 11 | |
| Read Data | 10111011 | 00111000 | | |
| Write Data | 10101010 | 10001101 | | |
| Rewrite Bits | (2bits) | (5bits) | | ← Majority only in Lower Bits |
| Data Inversion | 10101010 | 01110010 | 10 | ← Inversion of Lower Bits only |
| Write Execution | XXX0XXX0 | X1XX0X1X | | 1:Reset 0:Set X:Non-Rewrite |
| Read | | | | |
| Current Cell Data | 10101010 | 01110010 | 10 | |
| Read Data | 10101010 | 10001101 | | ← Inversion Read of Lower Bits only |

SEMICONDUCTOR MEMORY DEVICE AND SEMICONDUCTOR MEMORY SYSTEM

CROSS-REFERENCE TO RELATED APPLICATION

This application is based upon and claims the benefit of priority from prior Japanese Patent Application No. 2008-74087, filed on Mar. 21, 2008, the entire contents of which are incorporated herein by reference.

BACKGROUND OF THE INVENTION

1. Field of the Invention

The present invention relates to a semiconductor memory device and semiconductor memory system, and more particularly to a technology for writing data in a nonvolatile semiconductor memory.

2. Description of the Related Art

In recent years, a resistance variable memory has received attention as an alternative nonvolatile memory device to the flash memory. Examples of the resistance variable memory include a ReRAM (Resistance RAM) that uses a transition metal oxide in a recording layer to store the resistance state thereof nonvolatilely, and a PCRAM (Phase Change RAM) that uses a chalcogenide or the like in a recording layer to utilize the resistance information on the crystalline state (conductor) and the amorphous state (insulator).

Such the nonvolatile semiconductor memory device comprises an array of memory cells each including a variable resistive element and a rectifier such as a diode connected in series at each of cross-points of bit lines and word lines. Accordingly, it is suitable for realizing a high-density memory cell array. Multilayered memory cell arrays may be stacked to increase the memory capacity without increasing the area of the cell array portion (for example, JP 2002-541613T).

The variable resistive element used in the nonvolatile semiconductor memory device of such the type varies the resistance thereof through the state change inside the element such as the migration of metal transition elements or the phase change. Therefore, an increase in times of the state change deteriorates the characteristics, a speed of change from one state to the other is extremely lower than that of change in the opposite direction, and either state is more unstable than the other. Thus, there are various performance deteriorating factors.

SUMMARY OF THE INVENTION

In an aspect the present invention provides a semiconductor memory device, comprising: a memory cell array including a plurality of mutually parallel word lines, a plurality of mutually parallel bit lines formed crossing the word lines, and a plurality of memory cells arranged at intersections of the word lines and bit lines, each memory cell having one end connected to the word line and the other end connected to the bit line; a read/write circuit operative to selectively apply a voltage for data read/write between the word line and the bit line and execute data read/write to the memory cell; and an operational circuit operative to compare certain length data read out by the read/write circuit from plural ones of the memory cells with certain length data to be written in the plural memory cells to make a decision, and create a flag representing the decision result, wherein the read/write circuit inverts each bit in the certain length data to be written in the memory cells in accordance with the flag and writes only rewrite-intended data of the certain length data and the flag into the memory cells at the time of data write, wherein the read/write circuit reads the certain length data together with the flag corresponding thereto and inverts each bit in the certain length data in accordance with the flag before the output thereof at the time of data read.

In another aspect the present invention provides a semiconductor memory device, comprising: a memory cell array including a plurality of mutually parallel word lines, a plurality of mutually parallel bit lines formed crossing the word lines, and a plurality of memory cells arranged at intersections of the word lines and bit lines, each memory cell having one end connected to the word line and the other end connected to the bit line; a read/write circuit operative to selectively apply a voltage for data read/write between the word line and the bit line and execute data read/write to the memory cell; and an operational circuit operative to make a decision on certain length data to be written in plural ones of the memory cells, and create a flag representing the decision result, wherein the memory cell can take a first state with higher stability and a second state with lower stability, wherein the operational circuit decides whether the number of bits associated with the memory cells changed to the second state is a majority of the certain length data to be rewritten in the plural memory cells, and creates a flag indicative of inverting each bit in the data to be written if it is the majority and a flag indicative of not inverting each bit unless it is the majority, wherein the read/write circuit inverts each bit in the certain length data to be written in the memory cells in accordance with the flag and writes only rewrite-intended data of the certain length data and the flag into the memory cells at the time of data write, wherein the read/write circuit reads the certain length data together with the flag corresponding thereto and inverts each bit in the certain length data in accordance with the flag before the output thereof at the time of data read.

In yet another aspect the present invention provides a semiconductor memory system, comprising: a semiconductor memory chip including a plurality of mutually parallel word lines, a plurality of mutually parallel bit lines formed crossing the word lines, a plurality of memory cells arranged at intersections of the word lines and bit lines, each memory cell having one end connected to the word line and the other end connected to the bit line, and a read/write circuit operative to selectively apply a voltage for data read/write between the word line and the bit line and execute data read/write to the memory cell; and a controller operative to control data read and write to the semiconductor memory chip, wherein the system compares certain length data read out of plural ones of the memory cells with certain length data to be written in the plural memory cells to make a decision, and creates a flag representing the decision result, wherein the system inverts each bit in the certain length data to be written in the memory cells in accordance with the flag and writes only rewrite-intended data of the certain length data together with the flag into the memory cells at the time of data write, wherein the system reads the certain length data together with the flag corresponding thereto and inverts each bit in the certain length data in accordance with the flag, followed by error checking and correction, before the output thereof at the time of data read.

BRIEF DESCRIPTION OF THE DRAWINGS

FIG. 6 is a schematic cross-sectional view showing a non-ohmic element example in the same embodiment.

FIG. 12 shows an example of the data writing method.

FIG. 13 shows another example of the data writing method.

FIG. 15 is an illustrative view of a data writing and reading method according to a third embodiment of the present invention.

FIG. 16 is an illustrative view of a data writing and reading method according to a fourth embodiment of the present invention.

DETAILED DESCRIPTION OF THE EMBODIMENTS

The embodiments associated with the semiconductor memory device according to the present invention will now be described in detail with reference to the drawings.

First Embodiment

[General Configuration]

Figure 1:
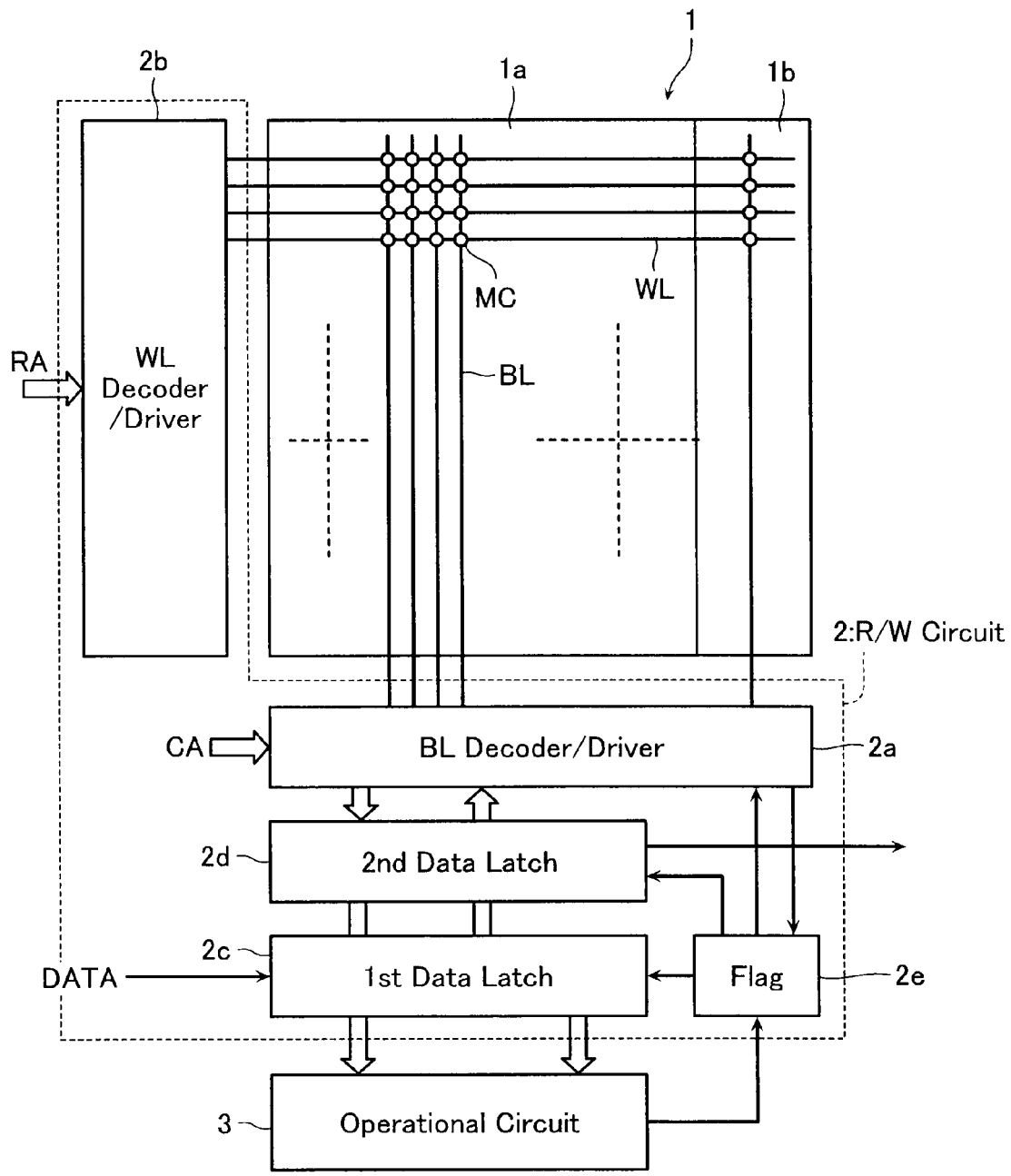
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a memory cell array 1, a read/write circuit (hereinafter referred to as "R/W circuit") 2 operative to execute data read and write to memory cells MC, and an operational circuit 3 operative to create a later-described flag at the time of data write and read.

The memory cell array 1 includes memory cells MC each using a later-described resistance variable element and arranged in matrix. It contains a data area 1a for storing data and a flag area 1b for storing a flag.

The R/W circuit 2 is configured as follows. A BL decoder/driver 2a is provided on a position adjacent to the memory cell array 1 in the bit line BL direction. It controls the bit line BL in the memory cell array 1 to erase data from the memory cell, write data in the memory cell, and read data out of the memory cell. A WL decoder/driver 2b is provided on a position adjacent to the memory cell array 1 in the word line WL direction. It selects the word line WL in the memory cell array 1 and applies voltages required to erase data from the memory cell, write data in the memory cell, and read data out of the memory cell. The BL decoder/driver 2a is connected to a first data latch 2c for storing write data, and a second data latch 2d for storing read data. The R/W circuit 2 includes a flag data latch 2e for storing a later-described flag. The write data stored in the first data latch 2c is transferred to the BL decoder/driver 2a as it is if the flag stored in the flag data latch 2e is "1" and transferred to the BL decoder/driver 2a after inversion of each bit if the flag is "0". The data read at the BL decoder/driver 2a is stored in the second data latch 2d, then provided to external as it is if the simultaneously read-out flag is "1", or provided to external after inversion of each bit if the flag is "0".

The operational circuit 3 performs a bit-by-bit comparison between the data stored in the first and second data latches 2c, 2d, makes a decision in accordance with a certain rule, creates a flag indicative of the decision result, and provides it to the flag data latch 2e.

The read data stored in the second data latch 2d is sent to an external host via a data I/O buffer, not shown.

[Memory Cell Array and Peripheral Circuit]

Figure 2:
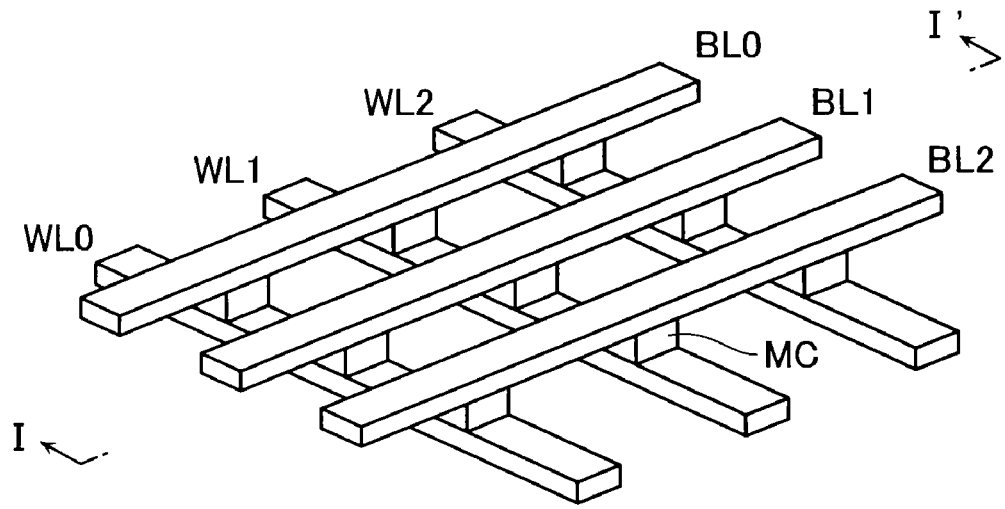
FIG. 2 is a perspective view of part of a memory cell array in the nonvolatile memory according to the same embodiment.
Figure 3:
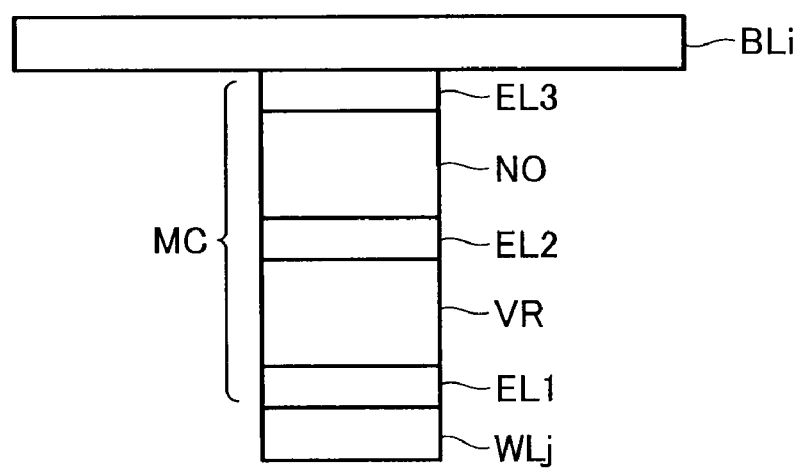
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive, low-resistance material such as W, WSi, NiSi, CoSi.

The memory cell MC comprises a serial connection circuit of a variable resistive element VR and a non-ohmic element NO as shown in FIG. 3.

Available examples of the variable resistive element VR include one that can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (contacting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
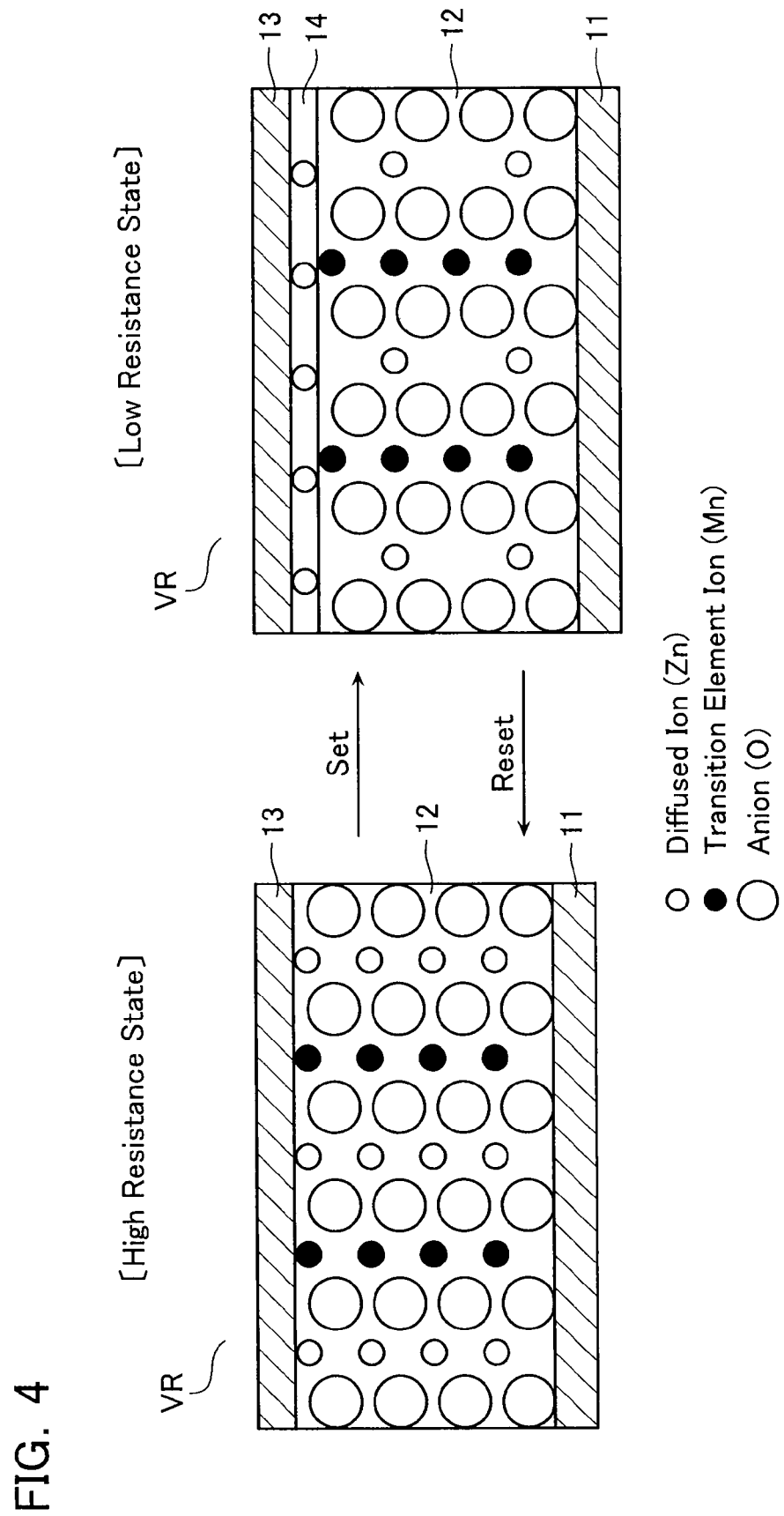
FIG. 4 is a schematic cross-sectional view showing a variable resistive element example in the same embodiment.
Figure 5:
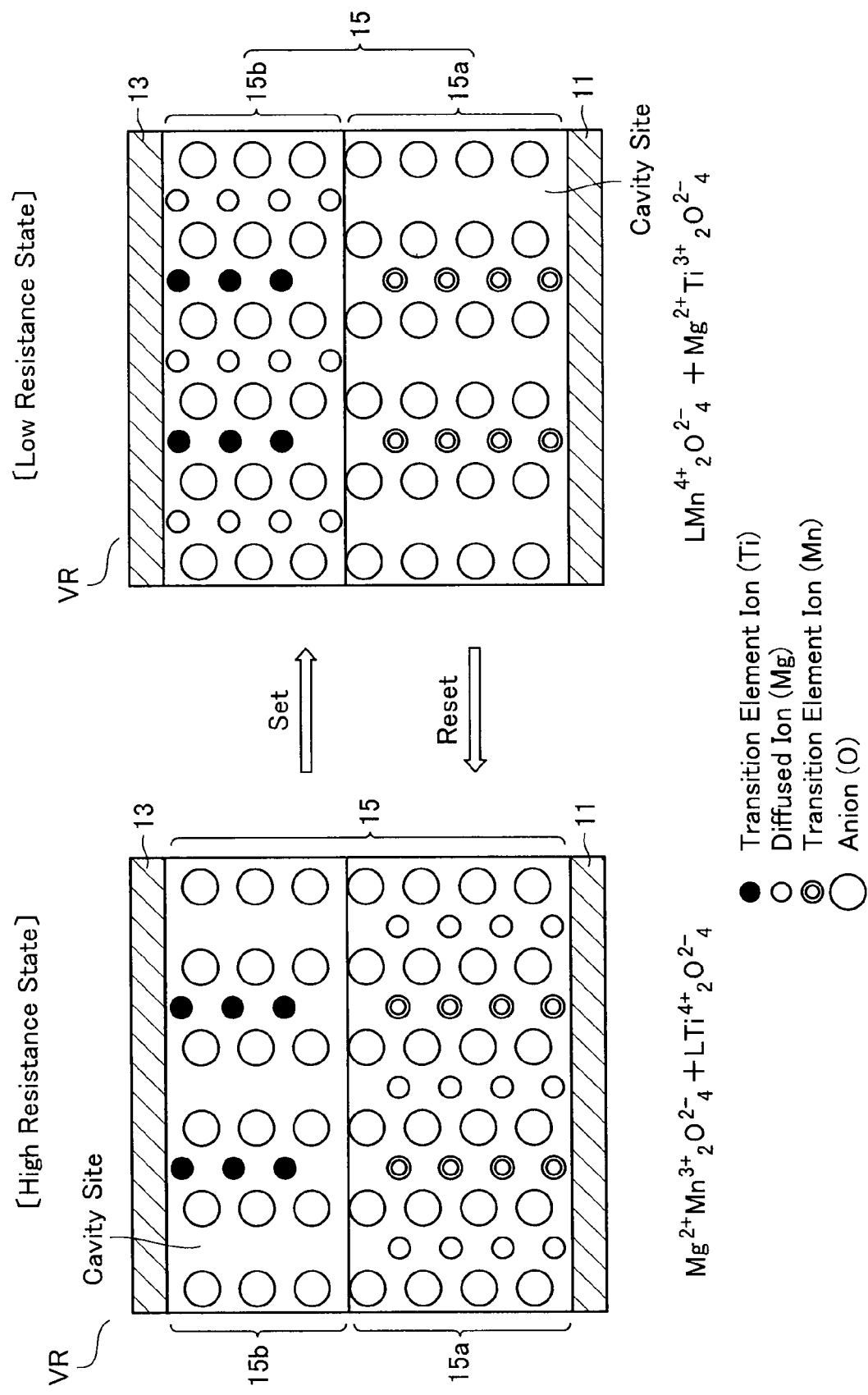
FIG. 5 is a schematic cross-sectional view showing another variable resistive element example in the same embodiment.

FIGS. 4 and 5 show examples of the ReRAM. The variable resistive element VR shown in FIG. 4 includes a recording layer 12 arranged between electrode layers 11, 13. The recording layer 12 is composed of a composite compound containing at least two types of cation elements. At least one of the cation elements is a transition element of which d-orbit is incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A represents Zn, M represents Mn, and X represents O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has cavity sites capable of accommodating cation elements from the first compound layer 15a.

In the example of FIG. 5, A represents Mg, M1 represents Mn, and X1 represents O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In the variable resistive element VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes cavity sites capable of accommodating diffused ions. Accordingly, the diffused ions moved from the first compound layer 15a are trapped in the cavity sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes as shown in FIG. 6, for example, (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistive element VR may be arranged in the opposite direction compared with FIG. 3 and the polarity of the non-ohmic element NO may be inverted.

Figure 7:
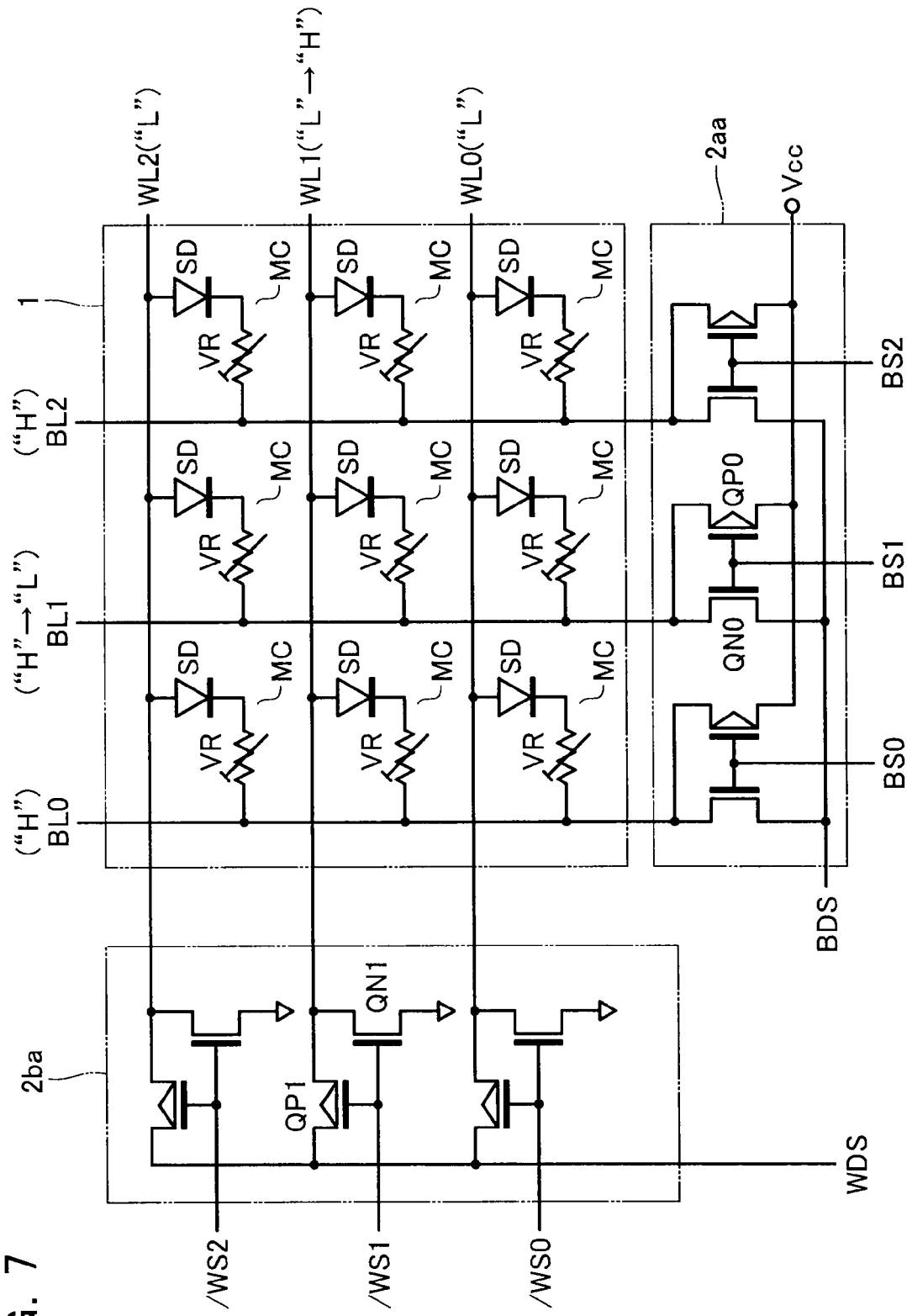
FIG. 7 is a circuit diagram of the memory cell array and peripheral circuits thereof in the nonvolatile memory according to the same embodiment.

FIG. 7 is a circuit diagram of part of the memory cell array 1 using a diode SD as the non-ohmic element NO and the R/W circuit 2.

In FIG. 7, the diode contained in the memory cell MC has an anode connected to a word line WL and a cathode connected via the variable resistive element VR to a bit line BL. Each bit line BL has one end connected to part of the BL decoder/driver 2a, or a selection circuit 2aa. Each word line WL has one end connected to part of the WL decoder/driver 2b, or a selection circuit 2ba.

The selection circuit 2aa includes a selection PMOS transistor QP0 and a selection NMOS transistor QN0, which are provided per bit line BL and have a commonly connected gate and a commonly connected drain. The selection PMOS transistor QP0 has a source connected to a higher potential power source Vcc. The selection NMOS transistor QN0 has a source connected to a bit line side drive sense line BDS for applying a write pulse and for supplying a current to be detected at the time of data read. The common drain of the transistors QP0, QN0 is connected to a bit line BL, and the common gate is supplied with a bit line selection signal BSi for selecting the bit line BL.

The selection circuit 2ba includes a selection PMOS transistor QP1 and a selection NMOS transistor QN1, which are provided per word line WL and have a commonly connected gate and a commonly connected drain. The selection PMOS transistor QP1 has a source connected to a word line side drive sense line WDS for applying a write pulse and for supplying a current to be detected at the time of data read. The selection NMOS transistor QN1 has a source connected to a lower potential power source Vss. The common drain of the transistors QP1, QN1 is connected to a word line WL, and the common gate is supplied with a word line selection signal /WSi for selecting the word line WL.

[Data Reading and Writing to Each Memory Cell]

The following description is given to data reading and writing to each memory cell.

Figure 8:
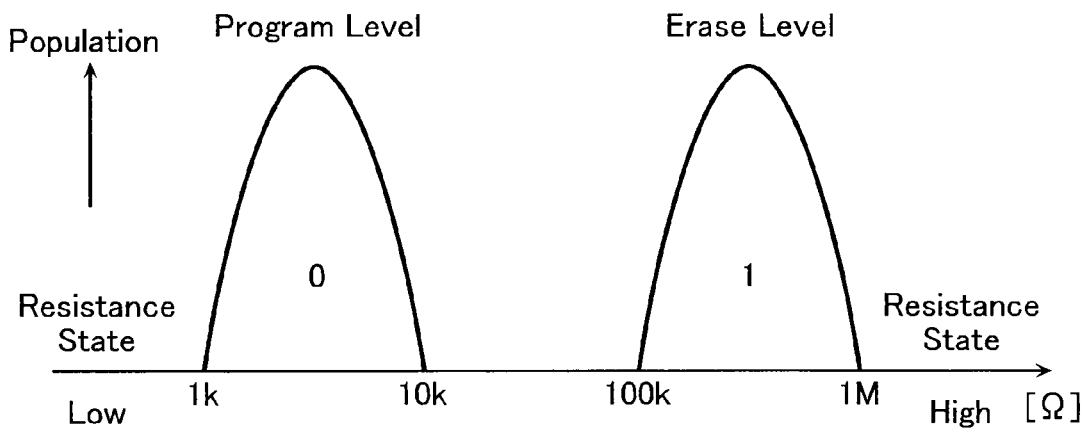
FIG. 8 is a graph showing a relation between resistance distributions and data among memory cells in the case of binary data.

In the above-described circuit, data can be stored as the magnitude of the resistance value of the resistive element VR in each memory cell MC. In the non-selected state, the word line selection signals /WS0, /WS1, . . . are turned to "H" level and the bit line selection signals BS0, BS1, . . . to "L" level, for example, to bring all the word lines WL to "L" level and all the bit lines BL to "H" level. In the non-selected state, the diodes SD in all the memory cells MC are off and reverse-biased to block current flowing in the variable resistive elements VR. If it is intended herein to select a central memory cell MC linked to the word line WL1 and the bit line BL1, the WL decoder/driver 2b turns the word line selection signal /WS1 to "L" level, and the BL decoder/driver 2a turns the bit line selection signal BS1 to "H" level. As a result, the word line WL1 is connected to the word line side drive sense line WDS and the bit line BL1 to the bit line side drive sense line BDS. Accordingly, application of "H" level to the drive sense line WDS and "L" level to the drive sense line BDS brings the word line WL1 to "H" level and the bit line BL1 to "L" level. Thus, in the selected cell, the diode SD is forward-biased to allow current to flow. In this case, the amount of current flowing in the selected cell can be determined by the resistance value of the resistive element VR. Therefore, data can be read out by sensing the magnitude of the amount of current. Namely, if the high-resistance, erased state corresponds to "1" and the low-resistance, programmed state to "0" as shown in FIG. 8, a smaller value of the sensed current can be detected as "1" and a larger one as "0".

The selected word line WL1 and non-selected bit lines BL are at "H" level and accordingly no current flows between both. Non-selected word lines WL and the selected bit line BL1 are at "L" level and accordingly no current flows between both as well. Therefore, no current flows in other memory cells than the selected memory cell.

The magnitude of such the value of current flowing in the memory cell MC can be sensed at a sense amplifier, not shown, contained in the BL decoder/driver 2a, thereby reading out data stored in the memory cell MC to the second data latch 2d. The sense amplifier may be provided on every bit line BL to read plural bits of data in batch from plural memory cells arranged in the word line WL direction. If the polarity of the diode is changed, data read may be executed at the word line WL by the sense amplifier provided in the WL decoder/driver 2ba.

Figure 9:
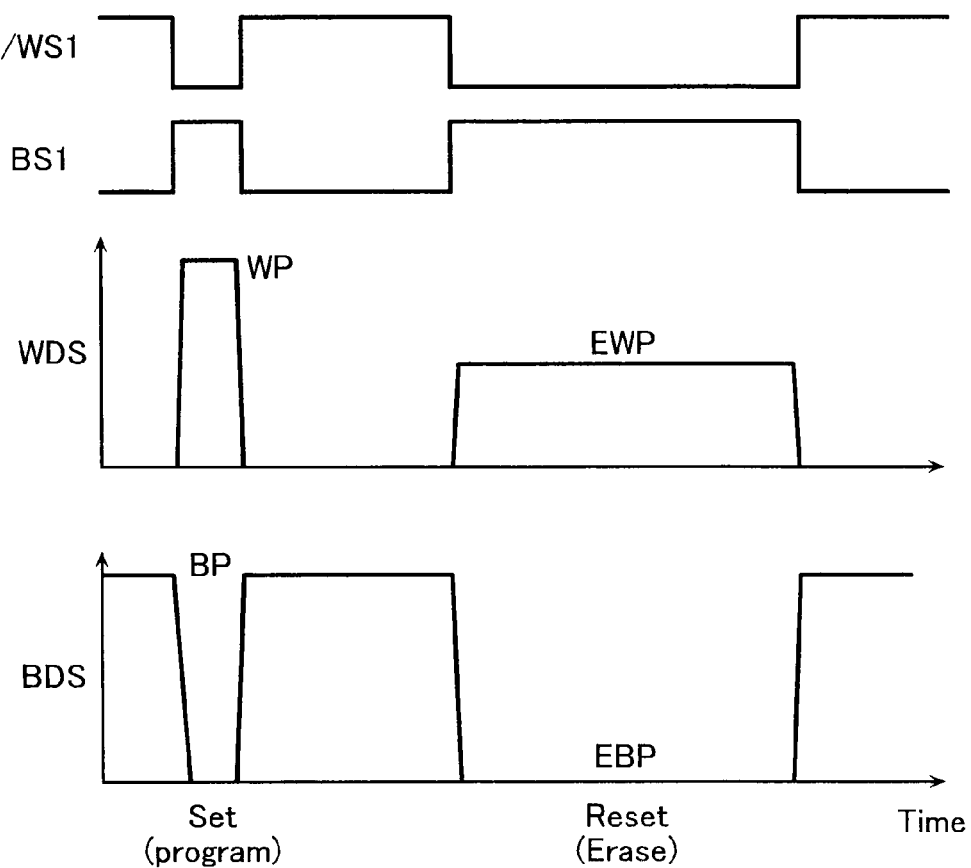
FIG. 9 is a waveform diagram showing selection signals /WS, BS and write pulses WP, BP at the time of data write in the same embodiment.

FIG. 9 is a waveform diagram showing the selection signals /WS, BS and the write pulses WP, BP to be applied to the drive sense lines WDS, BDS at the time of data write. The write pulses WP, BP are generated from a pulse generator containing a booster circuit, not shown.

When the variable resistive element VR is changed from the high-resistance state to the low-resistance state at the time of data set, the word line selection signal /WS1 on the word line WL1 corresponding to the data write-intended memory cell is turned to "L" level and the bit line selection signal BS1 on the bit line BL1 corresponding to the write-intended memory cell to "H" level. At the same time, the word line side drive sense line WDS is supplied with a write pulse WP for changing the resistance value of the variable resistive element from the erased level to the programmed level as shown in FIG. 8. The write pulse WP may have a pulse height of Vcc. At the same time, the bit line side drive sense line BDS is supplied with a negative write pulse at Vss level. Thus, the variable resistive element VR can be set from the high-resistance state (erased state) to the low-resistance state (programmed state).

When the variable resistive element VR is changed from the low-resistance state to the high-resistance state at the time of data reset, batch erase can be executed for plural memory cells though individual erase may be executed for each memory cell as well. In this case, the word line selection signal /WS1 on the word line WL1 corresponding to the data erase-intended memory cell is kept at "L" level for a longer time than that at the time of set and the bit line selection signal BS1 on the bit line BL1 corresponding to the write-intended memory cell at "H" level for a longer time than that at the time of set as well. At the time of erase, the memory cell is in the low-resistance state. Accordingly, the word line side drive sense line WDS is supplied with a lower erase pulse EWP than that at the time of set and the bit line side drive sense line BDS with a negative erase pulse EBP at Vss level. As a result, a larger current flows through the variable resistive element VR in the low-resistance state for a longer time to produce Joule heat, which can reset the variable resistive element to the high-resistance state.

[Certain Length Data Writing and Reading]

Application of the write pulse and the read pulse to the variable resistive element VR speeds up deterioration of the variable resistive element VR. Accordingly, it is intended to reduce the times of pulse application as low as possible. For that purpose, it can be considered that the write pulse or the read pulse may be applied only to the memory cell MC of which data is rewritten from "0" to "1" or from "1" to "0".

The present embodiment is configured to compare certain length (for example, 8-bit) data read out by the R/W circuit 2 from plural memory cells MC with certain length (for example, 8-bit) data to be written in the memory cells MC to make a decision, and create a flag representing the decision result. At the time of data write, each bit in the certain length data to be written in the memory cells is inverted in accordance with the flag to reduce the number of rewrite bits as small as possible.

Figure 10:
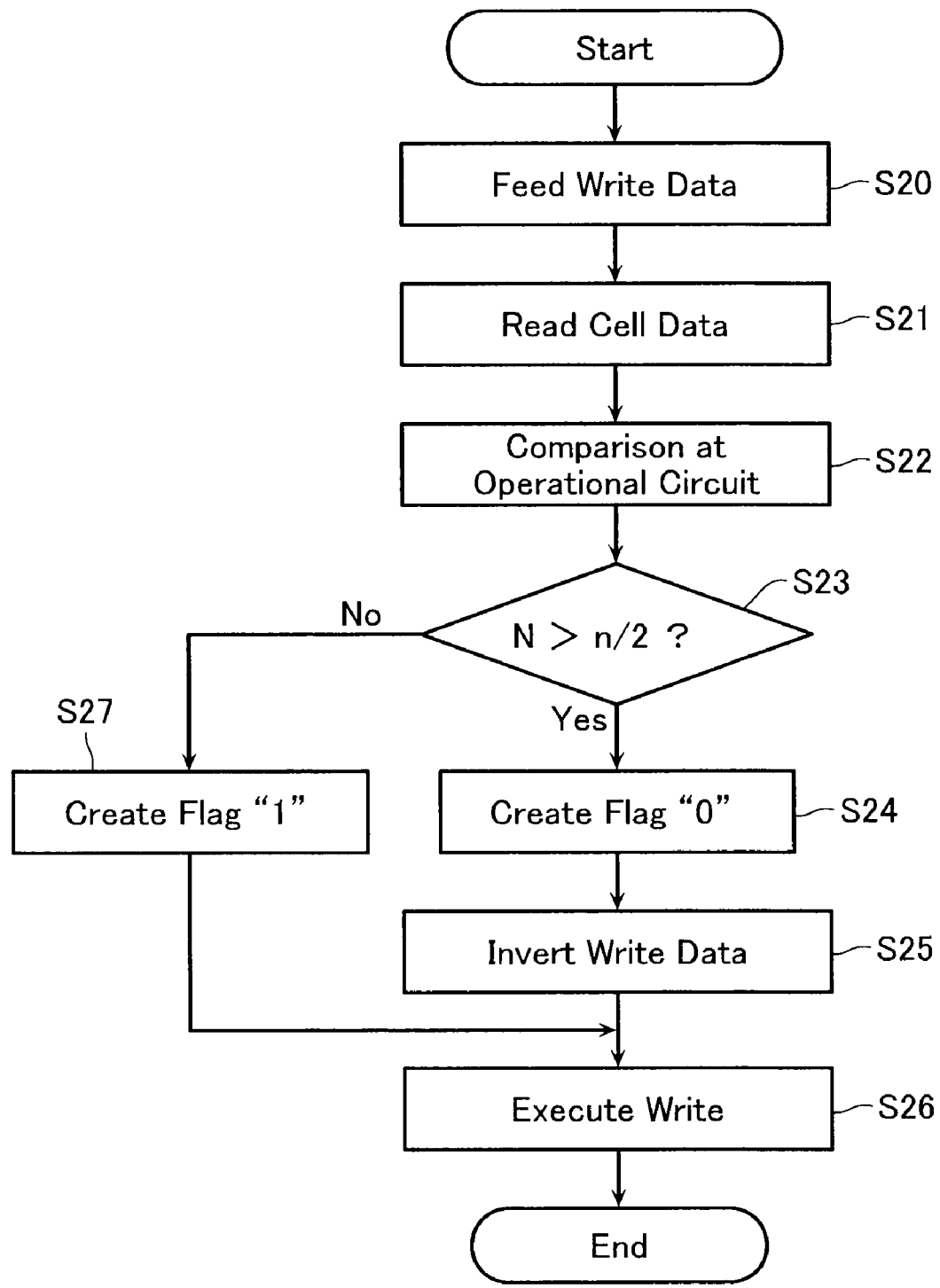
FIG. 10 is a flowchart of a data writing method according to the same embodiment.

FIG. 10 is a flowchart of a method for writing such the certain length data in the nonvolatile memory.

First, write data DATA is fed from external via an I/O buffer, not shown, and the data is stored in the first data latch 2c in the R/W circuit 2 (step S20).

Next, data in the memory cells at a write-intended place is read out by the BL decoder/driver 2a and the data is held in the second data latch 2d (step S21).

Subsequently, the write data stored in the first data latch 2c and the read data held in the second data latch 2d are fed to the operational circuit 3 for comparison and the number of bits different in value between both of data is obtained as the number of rewrite bits N (step S22).

Next, the operational circuit 3 decides whether the number of rewrite bits N is a majority of the number of all bits n (step S23). For example, if the data is 8-bit (that is, n=8), and the number of rewrite bits is 5-bit (that is, N=5), the result is N>n/2. This point is described in detail below.

If N>n/2 as a result of the decision at the step S23, a "0" value flag is created and stored in the flag data latch 2e (step S24). If N<n/2, a "1" value flag is created and stored in the flag data latch 2e (step S27). If the flag is "0", the number of rewrite bits is a majority of the data length. Accordingly, the write data DATA stored in the first data latch 2c is inverted bit by bit (step S25). Specifically, if the write data is "0", it is inverted to "1". If the write data is "1", it is inverted to "0".

Finally, the write data or the inverted data stored in the first data latch 2c and the flag stored in the flag data register 2e are written in the data area 1a and the flag area 1b of the memory cell array 1, respectively (step S26).

Figure 11:
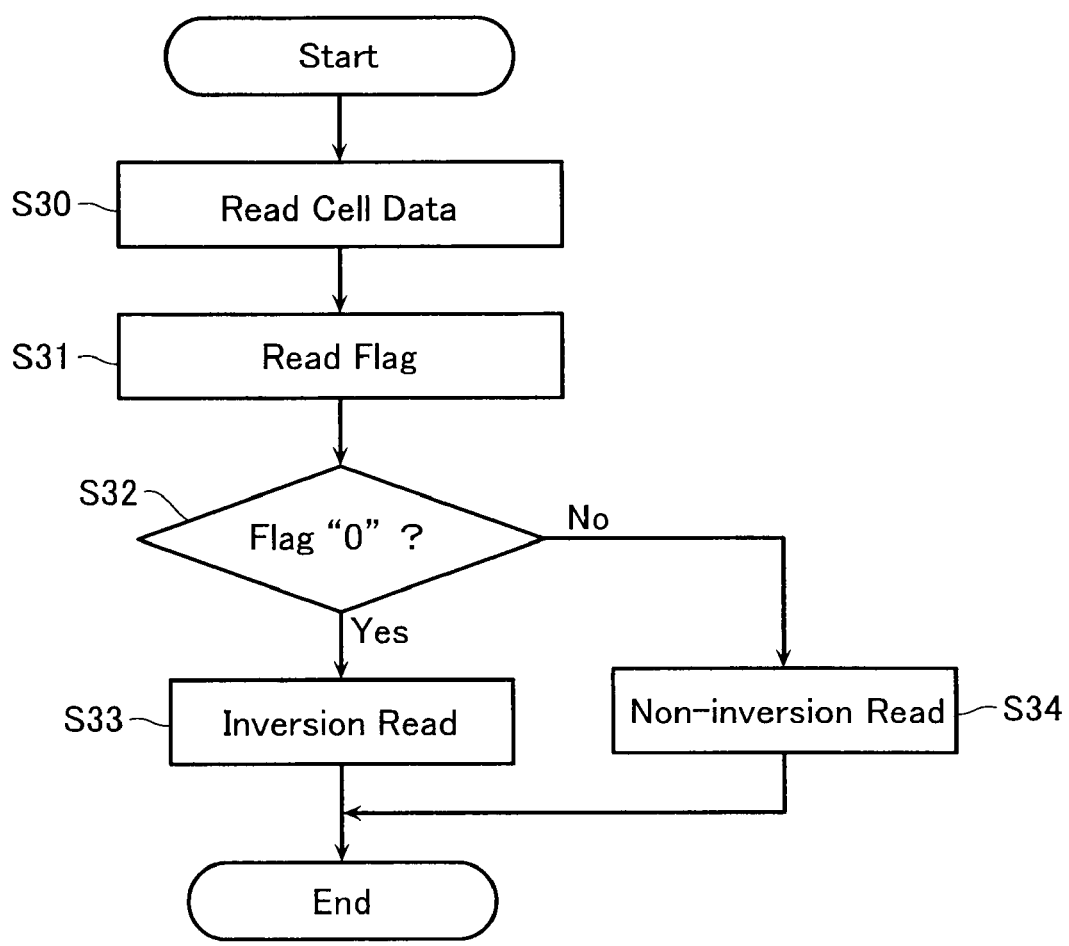
FIG. 11 is a flowchart of a data reading method according to the same embodiment.

The following description is given to a method for reading the data written in the memory cell 1 as described above. FIG. 11 is a flowchart describing a method for reading the data written in the memory cell MC.

First, the BL decoder/driver 2a is used to read data out of the selected memory cells MC on a certain-length basis, which is then stored in the second data latch 2d (step S30).

Simultaneously or subsequently, the flag in the flag area 1b corresponding to the certain length data in question is read out and stored in the flag data latch 2e (step S31).

If the flag is "0" (step S32), it indicates that the write data is inverted and written. Therefore, inversion is required also at the time of read. Accordingly, the read data stored in the second data latch 2d is inverted bit by bit and read out (step S33).

If the flag is "1" (step S32), on the other hand, it indicates that the write data is non-inverted. Therefore, non-inversion read is executed at the time of read (step S34).

The above data writing method is described in more detail with 8-bit data write taken as an example. FIG. 12 shows a case with inversion of write data while FIG. 13 shows a case with no inversion of write data.

First, when 8-bit "10111011" data has been stored in the data area 1a of the memory cell array 1 as shown in FIG. 12, writing write data "00011100" in the memory cell array 1 is considered.

In this case, the write data "00011100" is fed from external via the I/O buffer and held in the first data latch 2c. Then, the 8-bit data "10111011" is read out of the memory cell array 1 and stored in the second data latch 2d.

Next, the operational circuit 3 compares the write data in the first data latch 2c with the read data in the second data latch 2d. The comparison between the write data "00011100" and the read data "10111011" finds that the number of rewrite-required bits is 5-bit (N=5). As the number of all bits is equal to 8 (n=8), the number of rewrite bits holds a majority, that is, N>n/2.

In this case, the operational circuit 3 creates a flag "0", which is then stored in the flag data latch 2e. Then, the write data held in the first data latch 2c is inverted. As a result of inversion, the original write data "00011100" is converted into "11100011".

Next, flag data and cell data write is executed. FIG. 12 shows the write-intended cell data with "X1X00XXX" where X denotes a write-unnecessary bit. Initially, the number of rewrite bits N is 5-bit though, as a result of inversion of the write data, the number of bits to be actually rewritten becomes 3-bit, which reduces the number of rewrite bits.

After completion of write, the data "11100011" is written in the memory cells MC and flag data "0" is stored in the flag area 1b corresponding to that memory cells.

At the time of read, the 8-bit data is read out to the second data latch 2d, and the flag corresponding to the read 8-bit data is read out to the flag data latch 2e as well. If the flag stored in the flag data latch 2e is "0", the data stored in the second data latch 2d is inverted and read out. If the flag is "1", the data stored in the second data latch 2d is read out as it is. In the case of the above example, the flag is "0" and accordingly the 8-bit data "11100011" read out of the memory cell array 1 is inverted to "00011100" and read out. Therefore, consequently, the original write data "00011100" is equivalently written into the memory cells MC.

Next, the case with no execution of inversion write is described in detail with reference to FIG. 13.

Now, it is considered that 8-bit data "11100011" has been stored in the data area 1a of the memory cell array 1, and write data "11110001" is to be written in the memory cell array 1.

First, the write data "11110001" is fed from external via the I/O buffer and held in the first data latch 2c. Then, the 8-bit data "11100011" already stored is read out of the memory cell array 1 and stored in the second data latch 2d.

Next, the operational circuit 3 compares the write data in the first data latch 2c with the read data in the second data latch 2d. The comparison between the write data "11110001" and the read data "11100011" finds that the number of rewrite-required bits is 2-bit (N=2). As the number of all bits is equal to 8 (n=8), the number of rewrite bits is lower than a majority, that is, N<n/2.

In this case, the operational circuit 3 creates a flag "1".

Next, cell data write is executed. FIG. 13 shows the write-intended cell data with "XXX1XX0X" where X denotes a write-unnecessary bit.

The bit data in the memory cells after write becomes "11110001". In this case, the data is not inverted and accordingly the flag is "1". Reading from the memory cell array 1 is executed by non-inversion read because the flag data is "1".

Thus, the data writing method according to the first embodiment comprises execution of data inversion when a majority of bits is rewritten, thereby reducing the bits to be actually rewritten. As a result, it is made possible to reduce the times of effective rewrite in the memory cells and improve the reliability of the nonvolatile memory.

Second Embodiment

Figure 14:
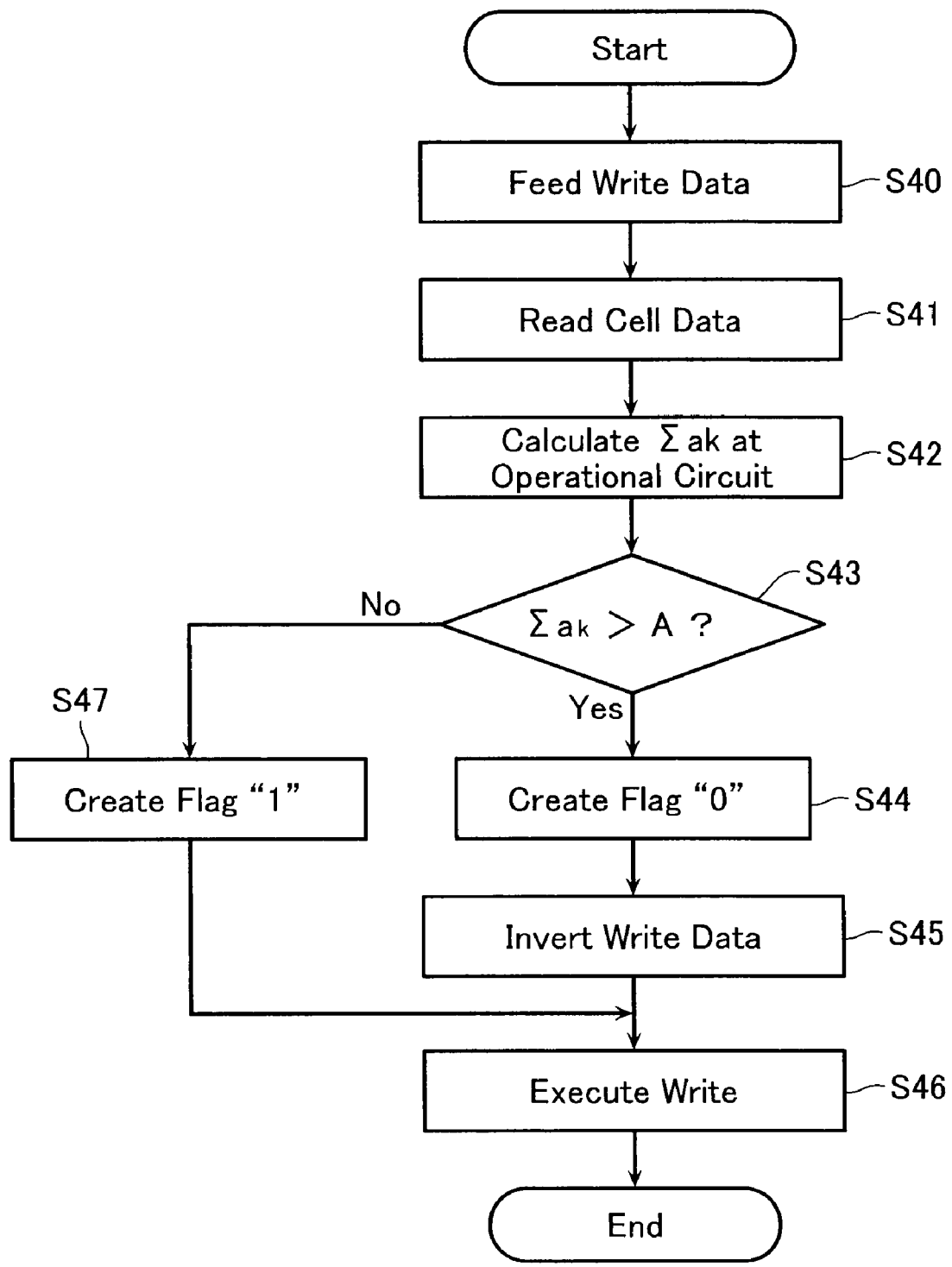
FIG. 14 is a flowchart of a data reading method according to a second embodiment of the present invention.

FIG. 14 is a flowchart of a data writing method according to a second embodiment of the present invention. The operational circuit 3 in the second embodiment has a decision algorithm, which weights a rewrite-intended bit in accordance with the bit order thereof before decision, different from the first embodiment.

First, write data is fed from external via an I/O buffer, not shown, and stored in the first data latch 2c (step S40).

On the other hand, data is read out of the memory cell array 1 at a write-intended place and stored in the second data latch 2d (step S41).

Next, the operational circuit 3 makes a comparison between both of data and weights rewrite-required bits in accordance with the bit orders thereof before addition. Specifically, a sum $\Sigma a_k$ of weighting factors $a_k$ (k indicates a bit order) is calculated (step S42).

Then, the operational circuit 3 decides whether the sum $\Sigma a_k$ of weighting factors exceeds a certain value A (step S43).

If $\Sigma a_k > A$ as a result of the decision at the step S43, a flag "0" is created (step S44), then the write data is inverted (step S45), and data write is executed (step S46). If $\Sigma a_k \leq A$, a flag "1" is created (step S47), and write is executed as it is (step S46).

The case of reading is similar to that in the first embodiment and accordingly omitted from the following description.

In the second embodiment, a larger value of the weighting factor $a_k$ can be given to the memory cell MC located closer to the end of the memory cell array 1 or one of divided MATs thereof to preferentially limit the times of rewrite in a poor characteristic memory cell MC located at the end.

Third Embodiment

FIG. 15 is an illustrative view of a third embodiment of the present invention.

The operational circuit 3 in the third embodiment has a decision algorithm, which inverts data appropriately, if the data has a bit pattern including rewrite bits all to be reset to "1", such that the rewrite bits are all set to "0".

For example, as shown in FIG. 15, if read data out of the memory cell array 1 is "11111000" and write data thereto is "11111111", only the last 3 bits are reset from "0" to "1" in the first embodiment. To the contrary, in the third embodiment, the write data is inverted to "00000000" and the first 5 bits are set from "1" to "0".

Under such the control, the rewrite bits are all subjected to set-write. The rewrite bits may be all subjected to set-write under the following condition as can be considered. Namely, if there is no memory cell held in the set state as it is between the read data from the memory cell array 1 and the write data thereto, each bit in the write-intended data is inverted. If there is no memory cell rewritten from the set state to the reset state between the read data from the memory cell array 1 and the write data thereto, each bit in the write-intended data is not inverted. Thus, the rewrite bits are all subjected to set-write. This is effective to improve the reduction in access time if the setting time is far shorter than the resetting time. The presence of resetting even 1 bit in combination, however, prevents exertion of this effect because set and reset can not be executed simultaneously or because the rewrite time is limited by the reset time even if they can be executed simultaneously.

The system of the third embodiment may be combined with the systems of other embodiments. In this case, if the improvement in access speed has priority, the system of the third embodiment may be executed preferentially than other systems.

Fourth Embodiment

FIG. 16 shows a data writing method according to a fourth embodiment of the present invention. The operational circuit 3 in the fourth embodiment has a decision algorithm, which divides write data into plural (2 in this example) parts, and configures a flag with plural bits.

When read data is "10111011 00111000" and write data is "10101010 10001101", rewrite bits in the upper 8 bits are 2 bits and rewrite bits in the lower 8 bits are 5 bits. Accordingly, the upper 8 bits are not inverted and the lower 8 bits are inverted before write. The flag is "10". As a result, rewrite bits can be reduced by 2 bits from 7 bits to 5 bits.

In data reading, the upper 8 bits and the lower 8 bits are inverted and not inverted, respectively, in accordance with the 2-bit flag, before read. In the case of the example in FIG. 16, as the flag is "10", the upper 8 bits are subjected to non-inversion read and the lower 8 bits to inversion read.

Fifth Embodiment

Figure 17:
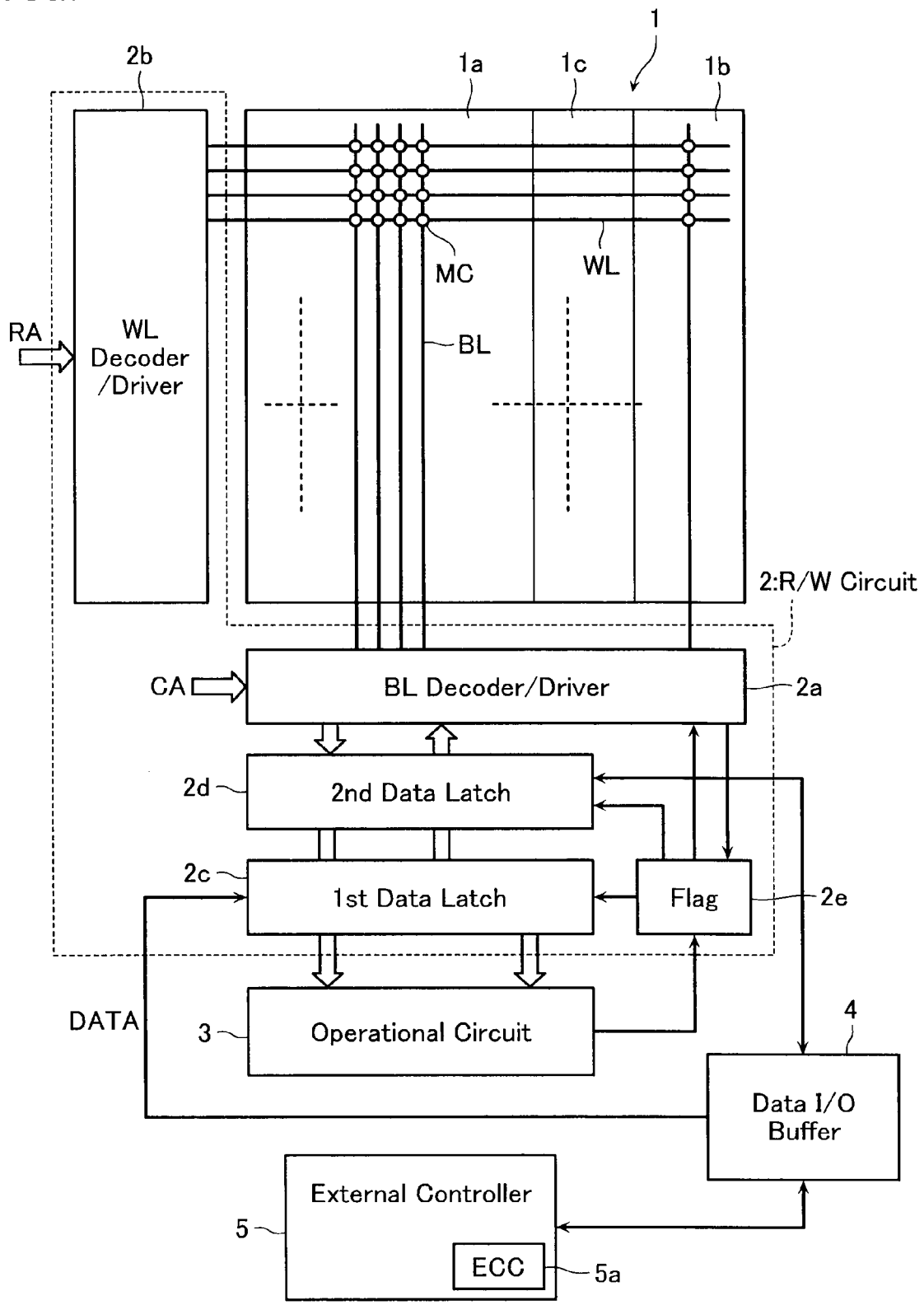
FIG. 17 is a block diagram showing a configuration of a nonvolatile semiconductor memory system according to a fifth embodiment of the present invention.

FIG. 17 is a block diagram showing a configuration of a nonvolatile semiconductor memory system according to a fifth embodiment of the present invention. In FIG. 17, the parts corresponding to those in FIG. 1 are denoted with the same reference numerals. This system comprises a memory chip, which includes the memory cell array 1, the R/W circuit 2, the operational circuit 3 and the data I/O buffer 4, and an external controller 5 provided outside the chip. The external controller 5 includes an error checking correction (hereinafter referred to as "ECC") circuit 5a.

In the shown example, the external controller 5 is provided outside the chip and the ECC circuit 5a is provided inside the external controller 5 though the ECC circuit may be provided inside the chip.

At the time of write, the ECC circuit 5a in the external controller 5 previously derives a check bit from write data and stores it in the first data latch 2c via the data I/O buffer 4.

On the other hand, from the data area 1a and a check bit area 1c in the memory cell array 1, the data and check bit stored in a place where the write data is to be recorded are read out and stored in the second data latch 2d.

The entire of the data and check bit is subjected to comparison/decision to create a flag indicative of inversion write or non-inversion write of the data and check bit and write the write data, the associated check bit and flag in the memory cell array 1.

At the time of read, the data and check bit read out of the memory cell array 1 are inverted or not inverted in accordance with the flag readout of the same memory cell array 1, and provided to the external controller 5 via the data I/O buffer 4. The ECC circuit 5a in the external controller 5 uses the read-out check bit to execute the error checking correction on the read data.

In the present embodiment, the read data before ECC bit inversion is compared with the write data in this way to decide the execution/non-execution of rewrite over the data state actually stored in the memory cell array 1, thereby limiting the times of rewrite.

In the present embodiment, it is also possible to limit the times of rewrite including the check bit.

Sixth Embodiment

Figure 18:
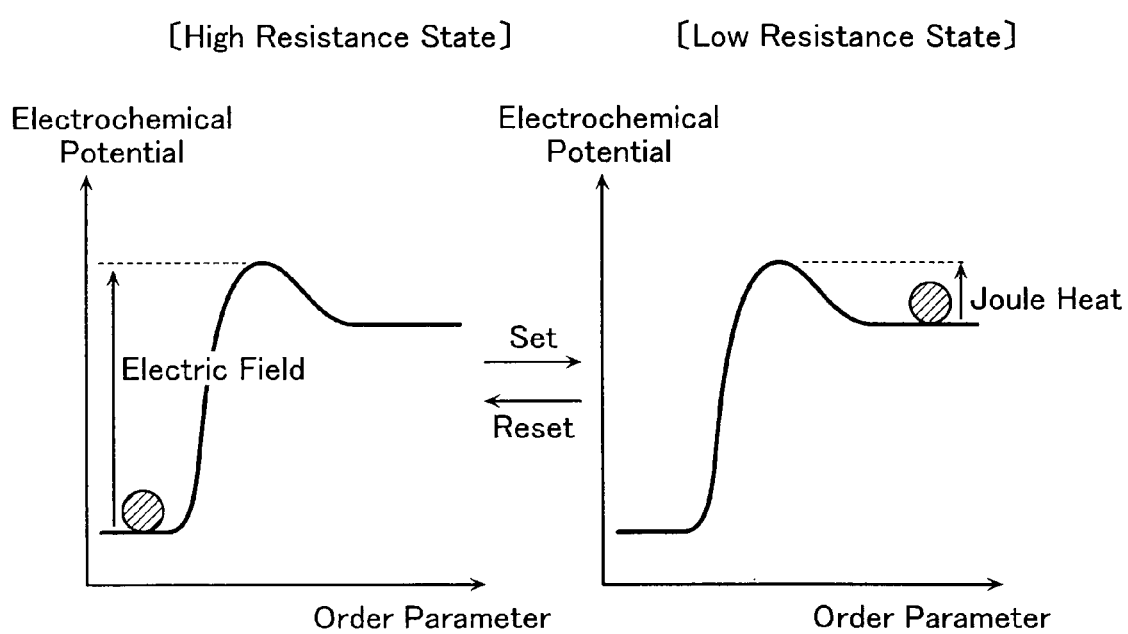
FIG. 18 is an illustrative view of a data writing method according to a sixth embodiment of the present invention.
Figure 19:
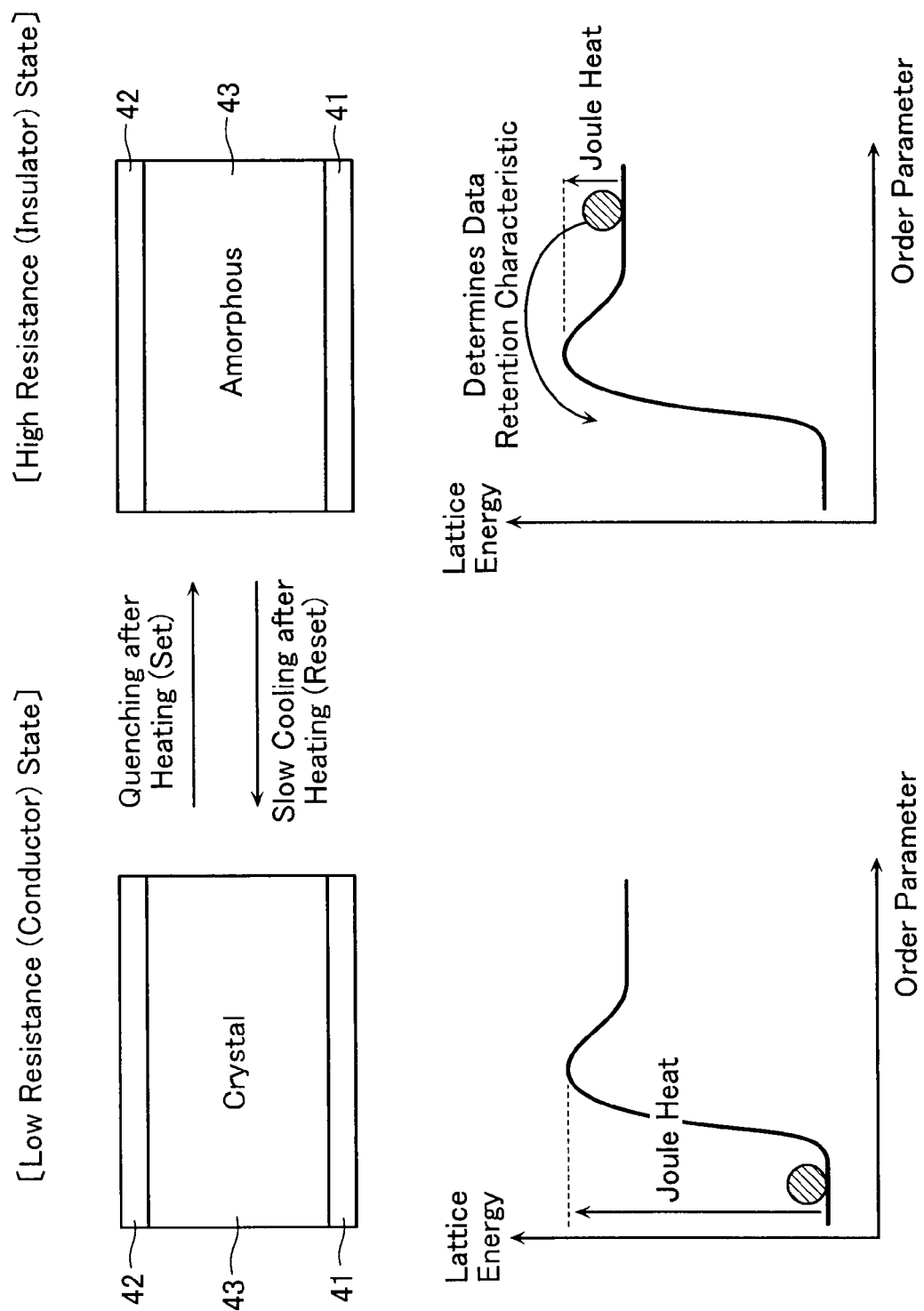
FIG. 19 is an illustrative view of the data writing method according to the same embodiment.

FIGS. 18 and 19 illustrate a sixth embodiment. In the sixth embodiment, if one of the high-resistance state and the low-resistance state of the variable resistive element VR is the stable state and the other is the unstable state, write data is inverted or not inverted so that memory cells brought into the stable state increase.

FIG. 18 schematically shows electrochemical potential distributions in the high-resistance state and the low-resistance state in the ReRAM shown in FIG. 5. In this example, setting and resetting can be achieved through a voltage (electric field) stage and a thermal stage to execute data write/erase. The high-resistance state with lower electrochemical potentials is the stable state. The low-resistance state with a lower potential barrier is relatively unstable and determines the data retention characteristics.

FIG. 19 shows a device structure and setting/resetting in the case of the PCRAM. In the case of the PCRAM, electrodes 41, 42 sandwich a chalcogenide layer 43 therebetween as a recording layer to configure a memory cell (variable resistive element). When the recording layer is in the crystalline state, it is in the low-resistance state (conductor) and the stable state.

From this state, through heating with Joule heat and then quenching, the recording layer becomes amorphous, or the high-resistance (insulator) state (setting). Slow cooling in the high-resistance state crystallizes the recording layer and returns it to the low-resistance state (reset).

In this example, the stable state is defined as "reset" and the unstable state as "set". In the ReRAM, "reset" correspond to the high-resistance state and "set" to the low-resistance state while in the PCRAM, "reset" correspond to the low-resistance state and "set" to the high-resistance state.

In the present embodiment, the operational circuit 3 operates in accordance with a decision algorithm, in which write data makes the number of memory cells MC in the "reset" state larger than the number of memory cells MC in the "set" state.

For example, in the case of the ReRAM, write data "10111011" includes 6 bits to be "reset" and 2 bits to be "set", thus the number of bits to be "reset" is larger. Accordingly, the flag is kept at "1" unchanged to write data as it is. On the other hand, write data "01001000" includes 2 bits to be "reset" and 6 bits to be "set", thus the number of bits to be "reset" is smaller. Accordingly, the flag is turned to "0" to invert write data and write the inverted data.

At the time of data write, the data read out of the memory cell array 1 is compared with the write data previously and only different bits may be rewritten.

Thus, it is possible to make a large number of cells in the stable state, which can improve the characteristics of the memory device.

Others

The embodiments of the invention have been described above though the present invention is not limited to these but rather can be given various changes, additions and so forth without departing from the scope and spirit of the invention. For example, the decision methods in the above embodiments may be combined together appropriately with priority order and executed. The present invention is also applicable to such memories (PMC, CBRAM) that include solid electrolytic storage elements.

What is claimed is:

1. A semiconductor memory device, comprising:
a memory cell array including a plurality of mutually parallel word lines, a plurality of mutually parallel bit lines formed crossing said word lines, and a plurality of memory cells arranged at intersections of said word lines and bit lines, each memory cell having one end connected to said word line and the other end connected to said bit line;
a read/write circuit operative to selectively apply a voltage for data read/write between said word line and said bit line and execute data read/write to said memory cell; and
an operational circuit operative to compare certain length data read out by said read/write circuit from plural ones of said memory cells with certain length data to be written in said plural memory cells to make a decision, and create a flag representing the decision result,
wherein said read/write circuit inverts each bit in said certain length data to be written in said memory cells in accordance with said flag and writes only rewrite-intended data of said certain length data and said flag into said memory cells at the time of data write, wherein said read/write circuit reads said certain length data together with said flag corresponding thereto and inverts each bit in said certain length data in accordance with said flag before the output thereof at the time of data read.

2. The semiconductor memory device according to claim 1, wherein said operational circuit compares said certain length data read out of said memory cells with said certain length data to be written in said memory cells, decides whether the number of bits to be rewritten between both data is a majority of the number of all bits, and creates a flag indicative of inverting each bit in said data to be written if it is the majority and a flag indicative of not inverting each bit unless it is the majority.

3. The semiconductor memory device according to claim 1, wherein each memory cell in said memory cell array is previously weighted with a restriction on rewrite times,
wherein said operational circuit compares said certain length data read out of said memory cells with said certain length data to be written in said memory cells, decides whether the total number of weights on bits to be rewritten between both data exceeds a certain value, and creates a flag indicative of inverting each bit in said data to be written if the total number of weights exceeds said certain value and a flag indicative of not inverting each bit unless the total number of weights exceeds said certain value.

4. The semiconductor memory device according to claim 3, wherein said memory cells are weighted on the basis of the positions of said memory cells in said memory cell array.

5. The semiconductor memory device according to claim 3, wherein said memory cells are weighted to restrict times of write to said memory cell located at the end of said memory cell array.

6. The semiconductor memory device according to claim 1, wherein said operational circuit compares said certain length data read out of said memory cells with said certain length data to be written in said memory cells, decides whether all bits to be rewritten between both data can be rewritten by writing a first value in said memory cells, and creates a flag indicative of inverting each bit in said data to be written if said data to be written can be rewritten by inverting each bit and a flag indicative of not inverting each bit if said data to be written can be rewritten by not inverting each bit.

7. The semiconductor memory device according to claim 6, wherein said operational circuit creates a flag indicative of inverting each bit in said data to be written in the absence of said memory cell held at the first value unchanged between said certain length data read out of said memory cells and said certain length data to be written in said memory cells.

8. The semiconductor memory device according to claim 6, wherein said operational circuit creates a flag indicative of not inverting each bit in said data to be written in the absence of said memory cell to be rewritten from the first value to a second value between said certain length data read out of said memory cells and said certain length data to be written in said memory cells.

9. The semiconductor memory device according to claim 1, wherein said operational circuit compares said certain length data read out of said memory cells divided into plural units with said certain length data to be written in said memory cells divided into plural units, respectively, on a unit basis, decides whether the number of bits to be rewritten between units is a majority of the number of bits in each unit, and creates a flag indicative of inverting each bit in the unit in said data to be written if it is the majority and a flag indicative of not inverting each bit in the unit unless it is the majority.

10. The semiconductor memory device according to claim 9, wherein said certain length data read out of said memory cells and said certain length data to be written in said memory cells are divided into two, upper and lower units.

11. The semiconductor memory device according to claim 1, wherein said memory cell array includes a data area for storing said certain length data and a flag area for storing said flag.

12. The semiconductor memory device according to claim 1, wherein said memory cell includes a variable resistive element that varies the resistance thereof in accordance with the state change inside the element.

13. A semiconductor memory device, comprising:
a memory cell array including a plurality of mutually parallel word lines, a plurality of mutually parallel bit lines formed crossing said word lines, and a plurality of memory cells arranged at intersections of said word lines and bit lines, each memory cell having one end connected to said word line and the other end connected to said bit line;

a read/write circuit operative to selectively apply a voltage for data read/write between said word line and said bit line and execute data read/write to said memory cell; and an operational circuit operative to make a decision on certain length data to be written in plural ones of said memory cells, and create a flag representing the decision result, wherein said memory cell can take a first state with higher stability and a second state with lower stability, wherein said operational circuit decides whether the number of bits associated with said memory cells changed to the second state is a majority of said certain length data to be rewritten in said plural memory cells, and creates a flag indicative of inverting each bit in said data to be written if it is the majority and a flag indicative of not inverting each bit unless it is the majority, wherein said read/write circuit inverts each bit in said certain length data to be written in said memory cells in accordance with said flag, and writes only rewrite-intended data of said certain length data and said flag into said memory cells at the time of data write, wherein said read/write circuit reads said certain length data together with said flag corresponding thereto, and inverts each bit in said certain length data in accordance with said flag before the output thereof at the time of data read.

14. The semiconductor memory device according to claim 13, wherein said memory cell includes a variable resistive element that varies the resistance thereof in accordance with the state change inside the element.

15. The semiconductor memory device according to claim 14, wherein said memory cell includes a variable resistive element of which high-resistance state is used as the first state and low-resistance state as the second state, and of which reset state corresponds to the high-resistance state and set state to the low-resistance state.

16. The semiconductor memory device according to claim 14, wherein said memory cell includes a variable resistive element of which low-resistance state is used as the first state and high-resistance state as the second state, and of which set state corresponds to the high-resistance state and reset state to the low-resistance state.

17. A semiconductor memory system, comprising:

a semiconductor memory chip including a plurality of mutually parallel word lines, a plurality of mutually parallel bit lines formed crossing said word lines, a plurality of memory cells arranged at intersections of said word lines and bit lines, each memory cell having one end connected to said word line and the other end connected to said bit line, and a read/write circuit operative to selectively apply a voltage for data read/write between said word line and said bit line and execute data read/write to said memory cell; and a controller operative to control data read and write to said semiconductor memory chip, wherein said system compares certain length data read out of plural ones of said memory cells with certain length data to be written in said plural memory cells to make a decision, and creates a flag representing the decision result, wherein said system inverts each bit in said certain length data to be written in said memory cells in accordance with said flag and writes only rewrite-intended data of said certain length data together with said flag into said memory cells at the time of data write, wherein said system reads said certain length data together with said flag corresponding thereto and inverts each bit in said certain length data in accordance with said flag, followed by error checking and correction, before the output thereof at the time of data read.

18. The semiconductor memory system according to claim 17, wherein said system compares a check bit read out of said memory cells with a check bit generated from said certain length data to be written in said plural memory cells to make a decision, and creates a flag representing the decision result, wherein said system inverts said check bit generated from said certain length data to be written in said memory cells in accordance with said flag, and writes only rewrite-intended data of said check bit and said flag into said memory cells at the time of data write, wherein said system reads said check bit together with said flag corresponding thereto, and inverts said check bit in accordance with said flag before the output thereof, followed by error checking and correction of said certain length data using said check bit, at the time of data read.

19. The semiconductor memory device according to claim 18, wherein said memory cell array includes a data area for storing said certain length data, a flag area for storing said flag, and a check bit area for storing said check bit.

20. The semiconductor memory device according to claim 17, wherein said memory cell includes a variable resistive element that varies the resistance thereof in accordance with the state change inside the element.

* * * * *